United States Patent [19]

Connolly et al.

[11] Patent Number: 4,642,143
[45] Date of Patent: Feb. 10, 1987

[54] METHOD OF MAKING A DOUBLE HETEROSTRUCTURE LASER

[75] Inventors: John C. Connolly, Cranbury; Dan Botez, Mt. Holly, both of N.J.

[73] Assignee: RCA Corporation, Princeton, N.J.

[21] Appl. No.: 771,357

[22] Filed: Aug. 30, 1985

Related U.S. Application Data

[62] Division of Ser. No. 505,485, Jun. 17, 1983, Pat. No. 4,569,054.

[51] Int. Cl.[4] .......................................... H01L 21/208
[52] U.S. Cl. .................................. 148/171; 29/569 L; 29/576 E; 148/172
[58] Field of Search .............. 148/171, 172; 29/569 L, 29/576 E

[56] References Cited

U.S. PATENT DOCUMENTS

| | | | |
|---|---|---|---|
| 3,701,047 | 10/1972 | Caplan et al. | 331/94.5 H |
| 3,741,825 | 6/1973 | Lockwood et al. | 148/171 |
| 3,753,801 | 8/1973 | Lockwood et al. | 148/171 |
| 3,960,618 | 6/1976 | Kawamura et al. | 148/171 |
| 3,978,428 | 8/1976 | Burnham et al. | 331/94.5 H |
| 4,023,993 | 5/1977 | Scifres et al. | 148/172 |
| 4,073,676 | 2/1978 | Aiki et al. | 156/624 |
| 4,092,659 | 5/1978 | Ettenberg | 357/18 |
| 4,178,564 | 12/1979 | Ladany et al. | 331/94.5 H |
| 4,255,717 | 3/1981 | Scifres et al. | 331/94.5 H |
| 4,280,106 | 7/1981 | Scifres et al. | 331/94.5 H |
| 4,302,729 | 11/1981 | Burnham et al. | 331/94.5 H |
| 4,321,556 | 3/1982 | Sakuma | 372/45 |
| 4,347,486 | 8/1982 | Botez | 372/46 |
| 4,373,989 | 2/1983 | Beggs | 156/635 |
| 4,383,320 | 5/1983 | Botez et al. | 372/45 |
| 4,547,396 | 10/1985 | Botez et al. | 148/171 X |

OTHER PUBLICATIONS

Nakamura et al., *IEEE Journal of Quantum Electronics*, vol. QE-11, No. 7, pp. 436-439, (Jul. 1975).
Burnham et al., *IEEE Journal of Quantum Electronics*, vol. QE-11, No. 7, 439-449, (Jul. 1975).
Funakoshi et al., *Journal of Crystal Growth*, vol. 45, pp. 252-256 (1978).
Scifres et al., *Electronics Letters*, Vol. 18, No. 13, pp. 549-550 (1982).
Tarui et al., Journal of the Electrochemical Society, vol. 118, No. 1, pp. 118-122 (Jan. 1971).
Koszi et al., Journal of the Electrochemical Society, vol. 122, No. 12, pp. 1676-1680 (Dec. 1975).
Mori et al., Journal of The Electrochemical Society, vol. 125, No. 9, pp. 1510-1514 (Sep. 1978).
Iida et al., Journal of the Electrochemical Society, vol. 118, No. 5, pp. 768-771 (May 1971).
Shaw, Journal of the Electrochemical Society, vol. 128, No. 4, pp. 874-880 (Apr. 1981).

*Primary Examiner*—George T. Ozaki
*Attorney, Agent, or Firm*—B. E. Morris; W. J. Burke

[57] ABSTRACT

A semiconductor laser comprising a substrate having a plurality of closely spaced channels in the surface thereof with mesas separating the channels to form a channelled region in the surface of the substrate. A first cladding layer overlies the surface of the substrate and the channels and has a surface layer over the channelled region which is not coplanar with the surface of this layer over the surrounding substrate. A cavity region comprising a guide layer and an active layer overlies the first cladding layer and a second cladding layer overlies the active layer. The active layer and guide layer taper in thickness in the lateral direction. The invention also includes a method of fabricating this laser which includes the steps of forming a plurality of corrugations in the surface of the substrate, forming a solution having a super-saturated growth condition for planar and concave surfaces and an under-saturated growth condition for convex surfaces, contacting the corrugated surface to the solution thereby partially melting the convex portions of the corrugations and forming mesas therebetween. Growth over the corrugations is delayed thereby providing a planar surface of the first layer over a central portion of the channelled region which is non-planar with respect to the surface of the layer over the remainder of the substrate. The trough thus formed by the delayed growth over the channelled region provides a curved surface upon which the remaining layers of the laser are then sequentially deposited.

18 Claims, 4 Drawing Figures

METHOD OF MAKING A DOUBLE HETEROSTRUCTURE LASER

This is a division of application Ser. No. 505,485, filed 6-17-83 now U.S. Pat. No. 4,569,054.

The invention relates to a constricted double heterostructure laser including a substrate having a plurality of channels therein and a method of fabricating this laser by liquid-phase epitaxy.

BACKGROUND OF THE INVENTION

Botez in U.S. Pat. No. 4,347,486, incorporated herein by reference, has disclosed a constricted double heterostructure laser which comprises a body of semiconductor material having a substrate with a pair of spaced, substantially parallel channels in a surface thereof with a mesa therebetween. A first cladding layer overlies the surface of the mesa and partially fills the channels. A guide layer overlies the first cladding layer and an active layer overlies the guide layer. A second cladding layer overlies the active layer. The guide layer has a refractive index less than that of the active layer but larger than that of the first or second cladding layers. The active layer is the recombination region of the laser with the laser light being generated therein in the portion thereof over the mesa. The laser light beam so generated propagates in both the thin active region and, primarily, in the relatively thicker guide layer over the mesa. This laser has excellent selectivity against higher order modes of propagation since the waveguide formed by the active and guide layers in the lateral direction, the direction in the plane of the layers and perpendicular to the axes of the channels, exhibits high loss for those modes. Botez et al. in U.S. Pat. No. 4,383,320, incorporated herein by reference, have disclosed a laser of this type wherein the guide layer has a surface contacting the active layer which has a concave shape in the lateral direction over the mesa and which tapers in increasing thickness in the lateral direction with an active layer which is thickest over the mesa between the channels and which tapers in decreasing thickness in the lateral direction. This structure provides a positive index lateral waveguide for propagation in the active and guide layers, resulting in a reduced threshold current for lasing action and a reduced spontaneous emission near the threshold for laser emission.

The lateral tapering of the active and guide layers provides waveguiding in the lateral direction and is the key to the operation of this laser. This tapering arises from the non-uniform growth rate of layers deposited by liquid-phase epitaxial growth over the channels and mesa. The center-to-center spacing between the pair of channels as well as the individual channel geometry are critical to obtaining the proper curvature of the layers. It would be desirable to provide other means of obtaining this tapering of the active and guide layers.

SUMMARY OF THE INVENTION

The invention is a semiconductor laser which includes a plurality of adjacent channels extending into a substrate from a surface thereof with mesas separating the channels thereby forming a channelled region. The top surfaces of the mesas are not coplanar with the surface of the surrounding substrate. A first cladding layer overlies the channels and the mesas and has a flat surface over a center portion of the channelled region. A cavity region comprising a guide layer and an active layer overlies the surface of the first cladding layer and a second cladding layer overlies the active layer. Lasing action occurs in the active layer over the central portion of the channelled region.

The invention also includes a method of fabricating this laser which includes the steps of forming a plurality of adjacent corrugations in a substrate which extend between the end facets of the semiconductor body thereby forming a channelled region in the substrate surface and forming a solution containing the elements to be deposited and an element which is a solvent for the substrate material and having a super-saturated growth condition for concave and planar portions of the substrate surface and an under-saturated growth condition for convex portions of the substrate surface. The solution and substrate are then contacted, thereby causing meltback of the convex portions, or tips, of the corrugations to form a trough above the channelled region. The meltback of the corrugations locally delays the growth of the first deposited layer over the channelled region, thereby forming a surface of this layer over a center portion of the channelled region which is not coplanar with the surface of the surrounding substrate.

DETAILED DESCRIPTION OF PREFERRED EMBODIMENT

Figure 1:
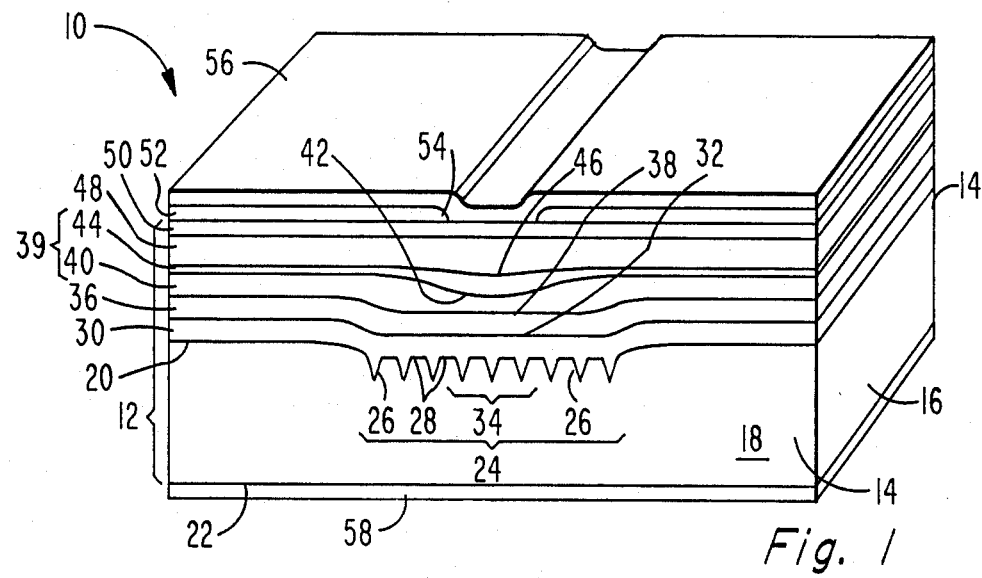
FIG. 1 is a perspective view of a semiconductor laser of the invention.

In FIG. 1 a semiconductor laser incorporating the present invention is designated as 10. The laser 10 comprises a body 12 of single crystal semiconductor material having spaced, parallel end facets 14 which are partially reflecting of light, with at least one of the end facets 14 being partially transparent so that light may be emitted therefrom. The body 12 also includes spaced, parallel side surfaces 16 which extend between and are perpendicular to the end facets 14.

The semiconductor body 12 includes a substrate 18 having spaced, substantially parallel major surfaces 20 and 22 which extend between and are perpendicular to the end facets 14 and the side surfaces 16 of the semiconductor body 12. In the first major surface 20 there is a channelled region 24 which extends between the end facets 14. The channelled region 24 comprises channels 26 which extend a distance into the substrate 18 from the first major surface 20 and mesas 28 between the channels 26. The top surfaces of the mesas 28 are typically below the level of the surrounding major surface 20. The channelled region 24 in effect forms a trough in the major surface 20. A buffer layer 30 overlies the first major surface 20, the channels 26 and the mesas 28 and has a surface 32 which is substantially planar over a center portion 34 of the channelled region 24. A first cladding layer 36 overlies the buffer layer 30 and has a substantially planar surface 38 over the center portion 34 of the channelled region 24. A cavity region 39 overlies the first cladding layer and is composed of a guide layer 40 and an active layer 44. The guide layer 40 overlies a surface of the first cladding layer and has a concave surface portion 42 over the center portion 34 of the channelled region 24. The active layer 44 overlies the guide layer and has a thick portion 46 over the concave surface portion 42 of the guide layer 40. A second cladding layer 48 overlies the active layer 44 and a capping layer 50 overlies the second cladding layer 48. An electrically insulating layer 52 overlies the capping layer 50 and has an opening 54 extending therethrough over the center portion 34 of the channelled region 24. A first electrical contact 56 overlies the electrically insulating layer 52 and the capping layer 50 and the region of the opening 54 in the electrically insulating layer 52. A substrate electrical contact 58 overlies the second major surface 22 of the substrate 18.

The substrate 18, the buffer layer 30 and the first cladding layer 36 are of one conductivity type and the second cladding layer 48 and the capping layer 50 are of the opposite conductivity type. In the cavity region 39 the positions of the guide layer 40 and the active layer 44 are interchangeable. The guide layer 40 is preferably positioned between the first cladding layer 36 and the active layer 44 and, in this case, has the same conductivity type as the first cladding layer 36. In some applications the guide layer 40 may be positioned between the active layer 44 and the second cladding layer 48 in which case it has the same conductivity type as the second cladding layer 48. The active layer 44 may be of either conductivity type but is typically only lightly electrically conducting. It is to be understood that the conductivity types of each of these layers may be reversed so long as the relationships of the conductivities of the various layers described above is maintained.

The compositions of particular layers of the laser 10 should be such that the refractive index of the active layer 44 is greater than the refractive index of the guide layer 40 which in turn is greater than the refractive indexes of the cladding layers 36 and 48. The laser may be formed of materials such as GaAs and AlGaAs which have the requisite refractive index differences. Alternatively, other combinations of group III-V alloys such as alloys containing indium, phosphorus, gallium and arsenic can be used.

The substrate 18 is preferably composed of N-type GaAs having a first major surface 20 parallel to the (100) crystallographic plane. The substrate may be misoriented from this orientation but preferably a {100} plane is used. The channels 26 are typically between about 1 and 4 $\mu$m deep, having a width at the surface 20 between about 1 and 4 $\mu$m. The channels are typically vee-shaped but may have another shape such as a flat bottom. The mesas typically have a hieght of between about 0 and 2 $\mu$m above the bottom of the channels.

The buffer layer 30 is typically composed of N-type GaAs. This layer is typically between about 1 and 3 $\mu$m over the substrate surface 20 and is typically between about 0.5 to 1.5 $\mu$m over the tops of the mesas 28. The surface portion 32 of the buffer layer 30 is substantially planar over the center portion 34 of the channelled region 24 and is depressed below the remainder of the surface 20 forming a trough over the channels 26. The curvature at the corners of this trough provide the initial curved surfaces which will cause a tapering in the lateral direction in the thickness of the overlying layers.

The first cladding layer 36 is typically composed of N-type $Al_rGa_{1-r}As$ where r is between about 0.25 and 0.45 and preferably about 0.30. This layer is preferably between about 1 and 2 $\mu$m thick over the channels 26. Preferably, the planar surface 38 of the first cladding layer 36 in the central portion 34 of the channelled region 24 is not coplanar with the surface 20 of the substrate 18 and is at greater height above the mesas 28 than the surface 20. The guide layer 40 is typically composed of N-type $Al_xGa_{1-x}As$ where x is between about 0.15 and 0.30 and is preferably about 0.22. This layer is typically between about 0.5 and 1.5 $\mu$m thick over the center portion 34 of the channels and has a concave surface portion 42 over the center portion 34 on which the active layer is deposited. The active layer 44 is typically composed of $Al_yGa_{1-y}As$ where y is between about 0.0 and 0.15 and prefer 0.07. This layer is typically between about 0.08 and 0.16 $\mu$m thick, the thickest portion being over the center portion 34 of the channelled region 24 and tapering in decreasing thickness in the lateral direction. The second cladding layer 48 is typically composed of P-type $Al_zGa_{1-z}As$ where z is between about 0.25 and 0.45 and preferably about 0.30. This layer is typically between about 0.8 and 1.5 $\mu$m thick. The capping layer 50 is typically composed of P-type GaAs and is used to facilitate ohmic electrical contact between the underlying semiconductor material and the overlying first electrical contact 56. This layer is typically between about 0.5 and 1.0 $\mu$m thick.

The electrically insulating layer 52 is preferably composed of silicon dioxide which is deposited on the capping layer 50 by pyrolytic decomposition of a silicon-containing gas, such as silane, in oxygen or water vapor. The opening 54 is formed using standard photolithographic masking techniques and etching processes. The first electrical contact 56 is then deposited over the capping layer 50 where it is exposed to the opening 54 and is preferably composed of sequentially evaporated titanium, platinum, and gold. The substrate electrical contact 58 is deposited on the major surface 22 by sequential evaporation and sintering of tin and silver followed by a plated nickel layer and a layer of gold.

The emitting end facet 14 of the laser 10 may be coated with a layer of $Al_2O_3$ or a similar material having a thickness of about one-half wave at the lasing wavelength as disclosed by Ladany et al. in U.S. Pat. No. 4,178,564. The opposed end facet 14 is coated with a reflector consisting of an electrical insulator such as $SiO_2$ coated with a layer of gold as disclosed by Caplan et al. in U.S. Pat. No. 3,701,047. Alternatively, the mirror may be a multi-layer reflector such as that disclosed by Ettenberg in U.S. Pat. No. 4,092,659. All three of these patents are incorporated herein by reference.

The laser of the invention, may be fabricated using well-known photolithographic masking techniques and etching processes to form the channels 26 with the mesas 24 therebetween followed by standard liquid-phase epitaxy deposition of the layers such as those disclosed by Lockwood et al. in U.S. Pat. No. 3,753,801, incorporated herein by reference, and by Botez in U.S. Pat. No. 4,347,486 to deposit the layers over the substrate surface containing the channels. The etching processes to form the channels may include selective chemical etching of a surface having a particular crystallographic orientation or ion etching. These techniques are well known in the art.

Figure 2:
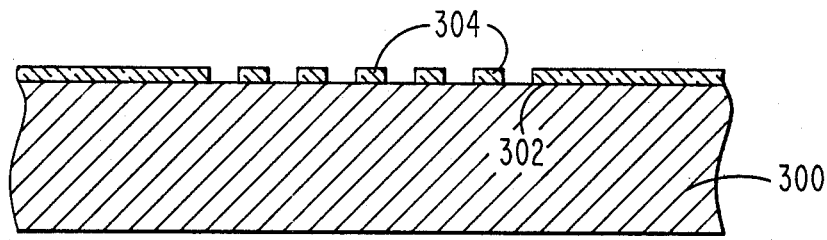
FIGS. 2–4 are cross-sectional views of a body at different steps in the device fabrication.
Figure 3:
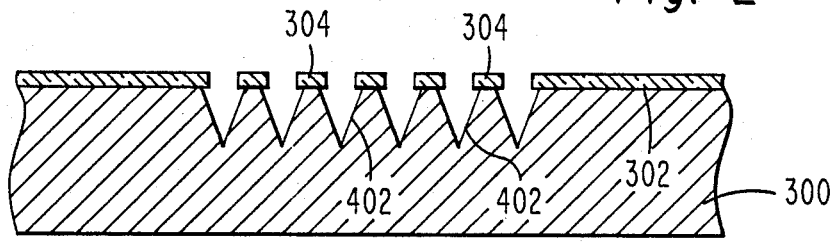

Alternatively the layers may be formed by first forming a series of, preferably equally spaced, adjacent vee-shaped channels thereby forming a corrugated surface as shown in FIGS. 2 and 3. In FIG. 2 a GaAs substrate 300 has formed on a major surface 302 thereof, which is preferably the (100) crystallographic plane, a plurality of stripes 304 composed of an etch-resistant material such as $SiO_2$. The stripes are formed using standard photolithographic masking techniques and etching processes and are preferably oriented along a (01$\bar{1}$) crystallographic direction on the (100) oriented surface. A preferential etch is then applied to the exposed surface of the substrate to form the vee-shaped channels 402 as shown in FIG. 3. Channels 402 having a vee shape are formed by undercutting the stripes 304 to the point where only a small portion of the original surface 302 remains to support the stripes 304.

The substrate having the corrugated surface is then inserted into a liquid-phase epitaxy apparatus such as that disclosed by Lockwood et al. and brought into contact with the solution from which the first layer is to be deposited on the channels 402 and the surface 302.

The sequence of events which occurs at the onset of the liquid-phase epitaxy deposition process depends critically on the characteristics of the solution and the shape of the substrate surface contacted by the solution. In the simplest case, a super-saturated solution containing the elements to be deposited and a solvent for the substrate material is brought into contact with a planar surface and uniform deposition onto the substrate occurs. If the solution is just saturated, nothing will happen. If the solution is under-saturated, meltback of the surface will occur until the solution becomes saturated.

However, if the surface is not planar but has a locally varying radius of curvature, then the degree of saturation of the contacting solution also locally varies. If the solution is just saturated for a planar surface, it will be super-saturated over concave portions of the surface, as viewed from the direction of the solution, and under-saturated over convex portions of the surface. Over the curved portion of the surface two effects can then occur: deposition occurs on the concave portions of the surface over which the solution is super-saturated and meltback of the substrate occurs on the convex portions of the surface over which the solution is under-saturated.

Figure 4:
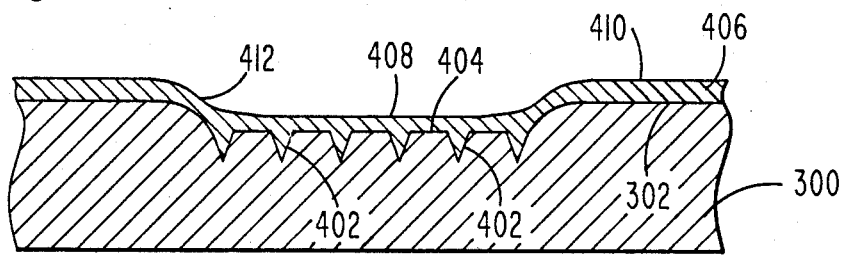

Applying these principles to the corrugated surface of the substrate 300, as shown in FIG. 4, the convex portions of the corrugations, that is, the tips of the projections which form the channels 402, undergo meltback forming the mesas 404 between the concave portions of the corrugations, now forming the channels 402. This meltback may continue until the mesas are eradicated thereby leaving a single wide channel. The meltback locally delays the growth over the newly formed mesas 404 and lowers the surfaces of the mesas below that of the surface 302 of the substrate. The growth proceeds, however, in the channels 402 and over the surface 302 so that the layer 406 is formed over the surface 302 and the surfaces of the channels 402 and the mesas 404. The layer 406 has a surface composed of three parts: a planar portion 408 over the channelled region, a planar portion 410 over the surface 302 which differ in their relative heights and are connected by the curved surface portions 412. The difference in height between the planar surface portions 408 and 410 together with the curved surfaces 412 provide a trough over the channels 402. This trough will cause the subsequently deposited layers to have locally concave surfaces over at least the central portion 34 of the channeled region 24, as shown in FIG. 1, which is the key to providing the proper lateral tapers for the overlying guide and active layers. We have found that a GaAs buffer layer or AlGaAs cladding layer can be deposited on the corrugated surface to provide this trough over the channelled region by carefully controlling the temperature of the solution, the degree of super-cooling used, and the cooling rate. In particular, we have found that an initial growth temperature, typically the temperature at which the solution is equilibrated, between 700° C. and 800° C., and preferably about 760° C., should be used. The range of temperatures through which the solution and substrate are cooled to a lower temperature is between about 2° and 10° C., and preferably between about 4° and 5° C. The cooling rate is typically between about 0.5° and 5° C., and preferably about 1° C. per minute. In this temperature range the meltback can be controlled and the rate of growth is significantly slower for the deposited layer than for the range of growth temperatures between 850° C. and 950° C. which are typically used.

The steps of the novel method of fabricating a double heterostructure laser is to form a plurality of adjacent corrugations on the surface of a substrate with the axis of the corrugations extending between what will become the end facets of the semiconductor body. Typically, a solution containing the elements to be deposited is equilibrated at a first temperature in contact with a source wafer as disclosed by Lockwood et al. in U.S. Pat. No. 3,741,825, incorporated herein by reference. Preferably, the solution and the substrate are then separately cooled through a range of temperatures to create a super-saturated growth condition for concave and planar portions of the surface and a slightly under-saturated growth condition for convex portions of the surface. The solution and the substrate are then contacted, typically by sliding a wafer into contact with the solution, thereby causing a partial meltback of the convex portions, or tips, of the corrugations forming mesas between the concave portions of the corrugations, i.e., the channels. Deposition of the first layer begins and continues until the planar surface is formed over the channels formed of the original corrugations and over the surrounding planar substrate thereby forming the trough. The remaining semiconductor layers of the laser are then deposited on this non-planar surface using standard liquid-phase epitaxy techniques.

This approach to the deposition of a layer by liquid-phase epitaxy in the fabrication of a semiconductor layer is also a more general method for locally delaying the growth of a layer on a surface of a body. The portion of the surface over which the growth is to be delayed is initially corrugated, preferably with the corrugations adjacent to one another. The corrugated portion of the surface may be a portion which is coplanar with the remainder of the surface. Alternatively the corrugated portion may be the surface of a mesa projecting outwards from the surface or it may be the surface of a channel of arbitrary shape extending into the body of semiconductor material. The key to the local delay of the deposition rate is the meltback of the convex portions of the corrugations at the onset of the deposition process. Thus the corrugated surface must initially be brought into contact with a solution comprising the elements to be deposited and an element which will meltback the material of the body having the corrugated surface. The condition of the solution should be such that there is a super-saturated growth condition for concave and planar portions of the surface and an under-saturated growth condition for convex portions of the surface. The degree of super-saturation will determine the rate of growth in the concave portions of the corrugations. The degree of under-saturation will determine the rate of meltback of the convex portions of the corrugations. The degree of saturation of the solution can be controlled by the initial temperature and the range of temperatures through which the solution is cooled.

In the operation of the laser of the invention under forward bias, electrical current flows through the first electrical contact 56 over the center portion 34 of the channelled region 24. Lasing action occurs over the central portion 34 of the channelled region 24 and propagation of the lasing light beam occurs in the tapered active and guide layers 44 and 40 respectively at a distance above the surface 20 such that the light beam does not interact with the substrate 18.

We claim:

1. A method of fabricating a laser which includes a body of semiconductor material including end facets and a substrate, and having a guide layer and an active layer which taper in thickness in the lateral direction, which method comprises the steps of:
   forming a plurality of corrugations comprising adjacent vee-shaped channels in a major surface of the substrate and which extend between the end facets;
   forming a first solution, comprising the elements to be deposited and an element which is also a solvent for the substrate material, having a super-saturated growth condition for planar and concave surfaces and an under-saturated growth condition for convex surfaces;
   contacting the surface of the substrate having the corrugations therein to the first solution thereby causing a melting of the convex portions of the corrugations to form a plurality of mesas between the concave portions of the corrugations, wherein the surfaces of the mesas are below the surface of the substrate, thereby forming a trough in the surface of the substrate and causing deposition of a first layer to occur over the concave portions of the corrugations and the mesas and the surrounding substrate; and
   sequentially contacting the substrate with the first layer thereon to different solutions to deposit the remaining layers of the laser over the surface of the first layer.

2. The method of claim 1 wherein the step of forming the solution comprises the steps of equilibrating the first solution at an equilibration temperature and cooling the first solution to a lower temperature.

3. The method of claim 2 wherein the substrate is at said lower temperature.

4. The method of claim 3 wherein the substrate is GaAs, and the first solution includes aluminum, arsenic and gallium.

5. The method of claim 4 wherein said lower temperature at which the first solution in contact with a planar portion of the surface is saturated is between about 700° C. and 800° C.

6. The method of claim 5 wherein said lower temperature is about 760° C.

7. The method of claim 5 wherein the difference between said equilibration and lower temperatures is between about 2° and 10° C. and the cooling rate is between about 0.5° and 5° C. per minute.

8. The method of claim 7 wherein said difference is between about 4° and 5° C. and the cooling rate is about 1° C. per minute.

9. The method of claim 1 wherein the corrugations are adjacent to one another.

10. A method of locally delaying the deposition of a layer on a surface of a body comprising the steps of:
    forming a plurality of corrugations on the surface comprising adjacent vee-shaped channels;
    forming a first solution, comprising the elements to be deposited and an element which is a solvent for the material of the body, having a super-saturated growth condition for planar and concave portions of the surface and an under-saturated growth condition for convex portions of the surface of the substrate;
    contacting the surface having the corrugations therein to the first solution thereby causing a melting of the convex portions of the corrugations to form a plurality of mesas between the concave portions, wherein the surfaces of the mesas are below the surface of the substrate, thereby forming a trough in the surface of the substrate and causing deposition of the layer to occur over the concave portions of the corrugations and the mesas and the surrounding substrate; whereby the initial rate of deposition of the layer over the corrugated portion of the surface is less than the rate of deposition over the uncorrugated portion of the substrate.

11. The method of claim 10 wherein the step of forming the solution comprises the steps of equilibrating the first solution at an equilibration temperature and cooling the first solution to a lower temperature.

12. The method of claim 11 wherein the substrate is at said lower temperature.

13. The method of claim 12 wherein the substrate is GaAs, and the first solution includes aluminum, arsenic and gallium.

14. The method of claim 13 wherein said lower temperature at which the first solution in contact with a planar portion of the surface is saturated is between 700° and 800° C.

15. The method of claim 14 wherein said lower temperature is about 760° C.

16. The method of claim 14 wherein the difference between the equilibration and lower temperatures is between about 2° and 10° C. and the cooling rate is between about 0.5° and 5° C. per minute.

17. The method of claim 16 wherein said difference is between about 4° and 5° C. and the cooling rate is about 1° C. per minute.

18. The method of claim 10 wherein the corrugations are adjacent to one another.

* * * * *